(12) United States Patent
Kang et al.

(10) Patent No.: US 10,021,785 B2
(45) Date of Patent: Jul. 10, 2018

(54) PRINTED CIRCUIT BOARD AND METHOD OF MANUFACTURING THE SAME

(71) Applicant: Samsung Electro-Mechanics Co., Ltd., Suwon-si (KR)

(72) Inventors: Myung-Sam Kang, Hwaseong-si (KR); Young-Gwan Ko, Seoul (KR); Sang-Hoon Kim, Gunpo-si (KR); Kang-Wook Bong, Sejong-si (KR); Hye-Won Jung, Goyang-si (KR); Yong-Wan Ji, Gwangju-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/966,442

(22) Filed: Dec. 11, 2015

(65) Prior Publication Data

US 2016/0192491 A1 Jun. 30, 2016

(30) Foreign Application Priority Data

Dec. 26, 2014 (KR) .................. 10-2014-0190732

(51) Int. Cl.
*H05K 1/11* (2006.01)
*H05K 3/00* (2006.01)
(Continued)

(52) U.S. Cl.
CPC .......... *H05K 1/113* (2013.01); *H05K 3/0023* (2013.01); *H05K 3/4069* (2013.01);
(Continued)

(58) Field of Classification Search
CPC .............. H01L 21/563; H01L 21/6835; H01L 23/49816; H01L 23/49822; H01L 23/49894; H01L 2221/68345; H01L 2221/68359; H01L 2224/05568; H01L 2224/05573; H01L 2224/16225; H01L 2224/32225; H01L 2224/73204; H01L 2924/00014; H01L 2924/15311; H01L 2924/19041; H01L 2924/30105; H05K 1/056; H05K 1/113; H05K 1/115; H05K 1/116; H05K 1/162; H05K 1/0298; H05K 1/0313; H05K 3/0011; H05K 3/0023; H05K 3/428; H05K 3/4069; H05K 3/4644; H05K 2201/09509; H05K 2201/09845;
(Continued)

(56) References Cited

U.S. PATENT DOCUMENTS

| | | | | |
|---|---|---|---|---|
| 2002/0056192 A1* | 5/2002 | Suwa | .................. | H05K 3/423 29/847 |
| 2003/0235088 A1* | 12/2003 | Shepard | .............. | G11C 5/025 365/200 |

(Continued)

*Primary Examiner* — Timothy Thompson
*Assistant Examiner* — Guillermo Egoavil
(74) *Attorney, Agent, or Firm* — NSIP Law (57) ABSTRACT

A printed circuit board and a method of manufacturing the same are provided. The printed circuit board includes a first circuit layer disposed on an upper surface of a substrate, an insulating layer disposed on the substrate and the first circuit layer, a second circuit layer disposed on an upper surface of the insulating layer, and a via configured to connect between the first circuit layer and the second circuit layer, and a lower part of the via is in contact with the upper surface of the substrate.

8 Claims, 5 Drawing Sheets

(51) Int. Cl.
  *H05K 3/40* (2006.01)
  *H05K 3/46* (2006.01)
(52) U.S. Cl.
  CPC ... *H05K 3/4644* (2013.01); *H05K 2203/0502* (2013.01); *H05K 2203/0514* (2013.01)
(58) Field of Classification Search
  CPC .... H05K 2203/0502; H05K 2203/0514; G03F 7/0035; G03F 7/16; G03F 7/2022
  USPC ................ 174/264; 257/532, 777, E21.503, 257/E23.062, E23.069, E23.077; 438/106, 250
  See application file for complete search history.

(56) References Cited

U.S. PATENT DOCUMENTS

| | | | | |
|---|---|---|---|---|
| 2004/0087058 A1* | 5/2004 | Ooi | ................... | H01L 21/6835 438/106 |
| 2005/0106854 A1* | 5/2005 | Saiki | ................... | H05K 3/108 438/622 |
| 2005/0163938 A1* | 7/2005 | Yamazaki | ............ | G09G 3/3225 427/554 |
| 2006/0145331 A1* | 7/2006 | Cho | ................... | H01L 24/82 257/700 |
| 2006/0243479 A1* | 11/2006 | Kim | ................... | H05K 1/162 174/256 |
| 2007/0076392 A1* | 4/2007 | Urashima | ............ | H01G 2/06 361/763 |
| 2009/0146131 A1* | 6/2009 | Happ | ................... | H01L 27/222 257/5 |
| 2009/0255722 A1* | 10/2009 | Lee | ................... | H05K 1/116 174/264 |
| 2009/0294164 A1* | 12/2009 | Kim | ................... | H05K 1/116 174/262 |
| 2012/0301825 A1* | 11/2012 | Yoshida | ............ | G03F 7/0047 430/270.1 |
| 2013/0075688 A1* | 3/2013 | Xu | ................... | H01L 45/06 257/4 |
| 2014/0104798 A1* | 4/2014 | Park | ................ | H01L 23/49827 361/764 |
| 2016/0056136 A1* | 2/2016 | McConnelee | ........... | H01L 25/50 257/741 |
| 2016/0057857 A1* | 2/2016 | Mori | ................... | G03F 7/0035 174/264 |

* cited by examiner

PRINTED CIRCUIT BOARD AND METHOD OF MANUFACTURING THE SAME

CROSS REFERENCE TO RELATED APPLICATION

This application claims the benefit under 35 USC 119(a) of Korean Patent Application No. 10-2014-0190732, filed on Dec. 26, 2014, in the Korean Intellectual Property Office, the entire disclosure of which is incorporated herein by reference for all purposes.

BACKGROUND

1. Field

The present disclosure relates to a printed circuit board and a method of manufacturing the same.

2. Description of Related Art

With the widespread use of electronic devices with greater capabilities and smaller sizes, demands exist to produce circuit boards for mounting components that exhibit an increased circuit density and a reduced manufacturing cost.

However, there is a limitation in manufacturing fine circuits and reducing via sizes in order to form high density interlayer connections in printed circuit boards.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes a first circuit layer disposed on an upper surface of a substrate, an insulating layer disposed on the substrate and the first circuit layer, a second circuit layer disposed on an upper surface of the insulating layer, and a via configured to connect between the first circuit layer and the second circuit layer, and a lower part of the via is in contact with the upper surface of the substrate.

The insulating layer may be a photosensitive resin layer.

The first circuit layer may include a circuit pattern connected to the side surface of the via.

The circuit pattern may have a smaller line-width than the via.

The second circuit layer may include an upper via land formed on the upper part of the via.

The second circuit layer may include a circuit pattern formed integrally with the via.

In another general aspect, a printed circuit board includes a plurality of circuit layers, an insulating layer disposed between the plurality of circuit layers, and a via interconnecting the circuit layers, and a lower part of the via includes a landless via in contact with the insulating layer.

The insulating layer may be a photosensitive insulating layer.

In another general aspect, a printed circuit board includes a lower part circuit layer disposed on a lower surface of an insulating layer, an upper part circuit layer, and a via extending from the lower surface of the insulating layer to a lower surface of the upper part circuit layer.

The insulating layer may be a photosensitive insulating layer.

The lower part circuit layer may include a circuit pattern in contact with the side surface of the via.

The circuit pattern may have a smaller line-width than the via.

The upper part circuit layer may include an upper via land formed on an upper part of the via.

The upper part circuit layer may include a circuit pattern formed integrally with the via.

In another general aspect, a method for manufacturing a printed circuit board involves preparing a substrate comprising a first circuit layer, forming an insulating layer on the substrate, forming a via hole in the insulating layer, eliminating a circuit pattern inside the via hole to expose a part of the substrate corresponding to a lower part of the via hole, and forming a second circuit layer on the insulating layer and a via in the via hole.

The insulating layer may be a photosensitive insulating layer.

The forming of the via hole in the insulating layer may be performed using photolithography.

The forming of the via hole in the insulating layer may involve forming a plurality of via holes at the same time using photolithography.

In another general aspect, a printed circuit board includes a first circuit layer disposed on a substrate, an insulating layer disposed on the substrate and the first circuit layer, a second circuit layer disposed on the insulating layer, and a via penetrating the insulating layer and electrically connect the first circuit layer and the second circuit layer, a portion of a side surface of the via being in contact with the first circuit layer.

A bottom surface of the via may contact the substrate.

Other features and aspects will be apparent from the following detailed description, the drawings, and the claims.

BRIEF DESCRIPTION OF THE DRAWINGS

FIG. 4 is a flowchart illustrating an example of a method for manufacturing a printed circuit board according to the present disclosure.

Throughout the drawings and the detailed description, the same reference numerals refer to the same elements. The drawings may not be to scale, and the relative size, proportions, and depiction of elements in the drawings may be exaggerated for clarity, illustration, and convenience

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The terms used hereinafter are defined by considering their functions in the present disclosure and can be changed according to the intention, convention, etc. of the user or operator.

In descriptions of components of the disclosure, the same reference numerals are used to designate the same or similar components, regardless of the figure number. Throughout the description of the present disclosure, when describing a certain technology is determined to evade the point of the present disclosure, the pertinent detailed description will be omitted. It will be understood that, although the terms "first," "second," etc. may be used herein to describe various elements, these elements should not be limited by these terms. These terms are only used to distinguish one element from another. Additionally, components of the drawings are not necessarily drawn according to their scales. For example, sizes of some components of the drawings may be exaggerated, omitted or schematically illustrated for the convenience of understanding of the present disclosure.

Hereinafter, configurations and effects of the present disclosure will be described in detail with reference to the accompanying drawings.

Printed Circuit Board

Figure 1:
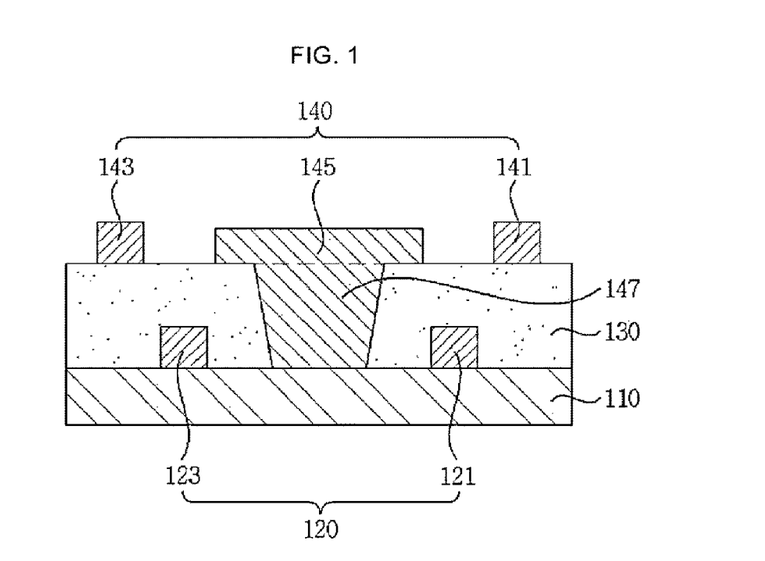
FIG. 1 is a sectional view illustrating an example of a printed circuit board according to the present disclosure.
Figure 2:
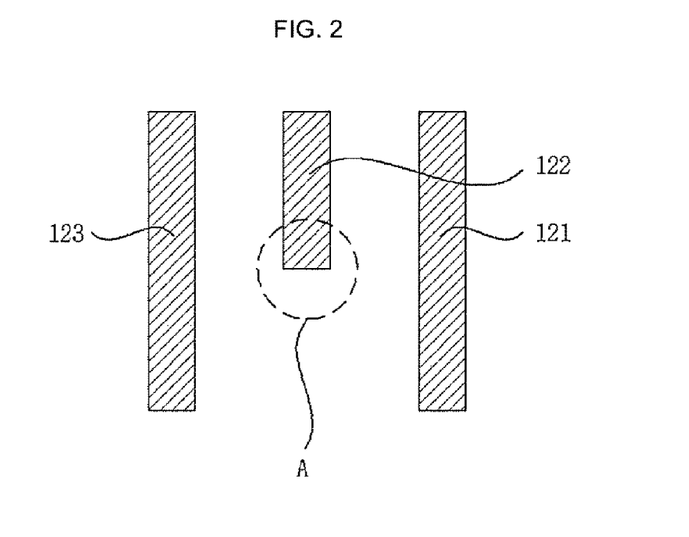
FIG. 2 is a plan view schematically illustrating an example of a first circuit layer according to FIG. 1.
Figure 3:
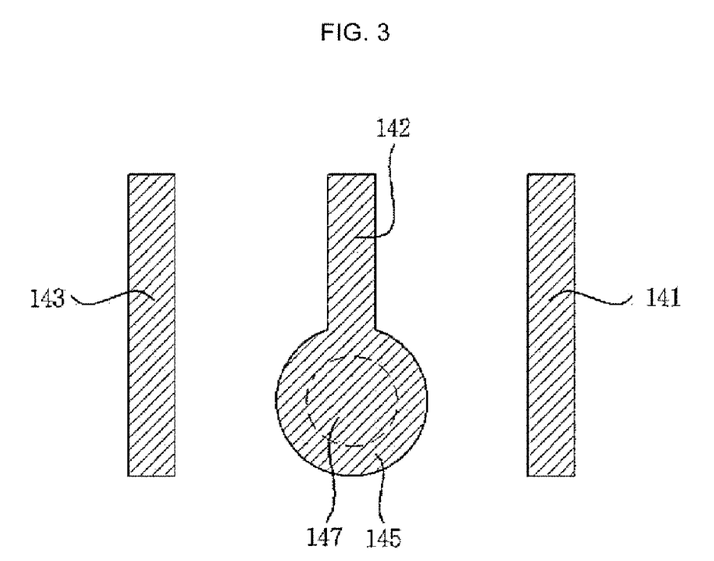
FIG. 3 is a plan view schematically illustrating an example of a second circuit layer according to FIG. 1.

FIG. 1 illustrates a sectional view of an example of a printed circuit board, FIG. 2 schematically illustrates a plan view of an example of a first circuit layer of FIG. 1, and FIG. 3 schematically illustrates a plan view of an example of a second circuit layer of FIG. 1.

Referring to FIG. 1, a printed circuit board include a first circuit layer 120 formed on the upper surface of a substrate 110, an insulating layer 130 on the substrate 110 on which the first circuit layer 120 is formed, a second circuit layer 140 formed on the upper surface of the insulating layer 130, and a via 147 configured to connect between the first circuit layer 120 and the second circuit layer 140. In this example, the via 147 extends from the lower surface of the insulating layer 130 to the lower surface of the upper part circuit layer 140, such that the lower part of the via 147 contacts the upper surface of the substrate 110.

In this example, the via 147 is formed in a tapered shape in which a diameter of the via 147 becomes gradually smaller from the upper surface to the lower surface. However, the shape of the via 147 is not limited thereto. In another example, the via 147 may be formed in a cylinder shape having the substantially same diameter through the insulating layer 130.

Referring to FIG. 2, the first circuit layer includes circuit patterns 121, 123 and a circuit pattern 122 that is connected with the side surface of a via.

The side part A of the circuit pattern 122 contacts the side surface of the via. That is, the circuit pattern 122 which is located inside the via may be eliminated to be connected with the side surface of the via. In this example, the circuit pattern 122 may have a smaller line-width compared to the via.

Referring to FIG. 3, the second circuit layer includes circuit patterns 141, 143, an upper via land 145 formed on the upper part of a via 147, and a circuit pattern 142 formed integrally with the via 147.

The second circuit layer 140 and the via 147 may be formed at the same time by the same process, so that the via 147 and the circuit pattern 142, which is connected with the via through the land 145, may be integrally formed. The upper via land 145 may be formed to have a greater diameter than that of the via with consideration of a processing error.

According to one example, a via size may be reduced to allow high density connection having a fine pattern and fine pitch, by implementing the lower part of the via as a lower landless via, not a circuit pattern, which is in contact with the insulating layer.

The substrate 110 may be a common resin insulating layer or a laminate having a plurality of circuit layers and a plurality of insulating layers alternately laminated therein.

When the substrate 110 is a multilayer printed circuit board, a blind via and a through via may be further formed to interconnect the circuit layers.

The circuit layer including the first circuit layer 120, the second circuit layer 140 and the via 147 may be formed of any conductive material that is used for circuits in the field of printed circuit boards. For example, the circuit layer may be formed of Cu but it may not be limited thereto.

The circuit layer may include a seed layer such as an immersion plating layer and an electro plating layer.

The insulating layer in the substrate 110 may be formed of any insulating resin which is usually used as an insulating material in the field of printed circuit boards. The insulating layer may be formed of a thermosetting resin such as an epoxy resin, a thermoplastic resin such as polyimide, a photosensitive resin, or a resin thereof further including a reinforcing agent such as a glass fiber or an inorganic filler. The insulating layer may be also formed of a resin such as prepreg, ajinomoto build-up film, FR-4, bismaleimide triazine and the like. The insulating layer 130 may be formed of a photosensitive resin.

Method for Manufacturing a Printed Circuit Board

FIG. 4 is a flowchart illustrating an example of a method for manufacturing a printed circuit board. FIG. 5 to FIG. 9 are sectional views illustrating an example of a method for manufacturing a printed circuit board.

Referring to FIG. 4, the method includes forming an inner-layer circuit pattern of S100, stacking an insulating layer of S200, forming a via hole of S300, eliminating the circuit pattern that is located inside the via hole of S400, and forming a via of S500.

Each step will be explained with reference to sectional views illustrated in FIG. 5 to FIG. 9.

Figure 5:
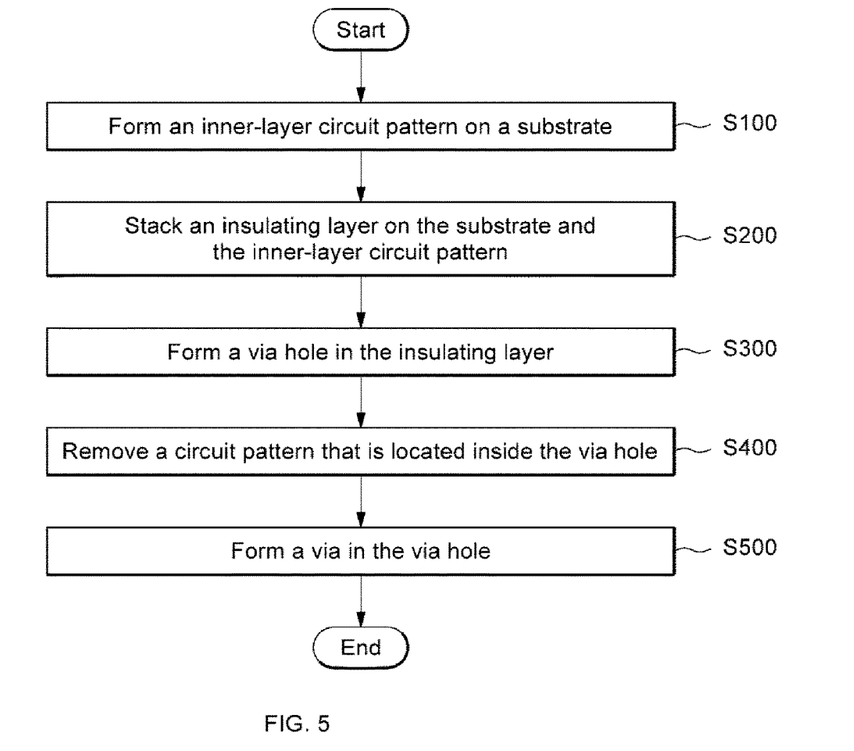
FIG. 5 to FIG. 9 are sectional views illustrating an example of a method for manufacturing a printed circuit board according to the present disclosure.

Referring to FIG. 5, a substrate 110 including a first circuit layer 120 may be prepared.

The substrate 110 may be a common resin insulating layer or a laminate having a plurality of circuit layers and a plurality of insulating layers alternately laminated therein.

When the substrate 110 is a multilayer printed circuit board, a blind via and a through via may be further formed to interconnect the circuit layers.

In this example, the first circuit layer 120 includes a plurality of circuit patterns 121, 122, 123. The first circuit layer 120 may be formed through a general circuit forming process such as a semi additive process (SAP), a modified semi additive process (MSAP), an additive process, and a subtractive process.

The first circuit layer 120 may be an inner-layer circuit pattern but a general via land may not be formed. The first circuit layer 120 may be designed to have the same circuit with circuit width.

Figure 6:
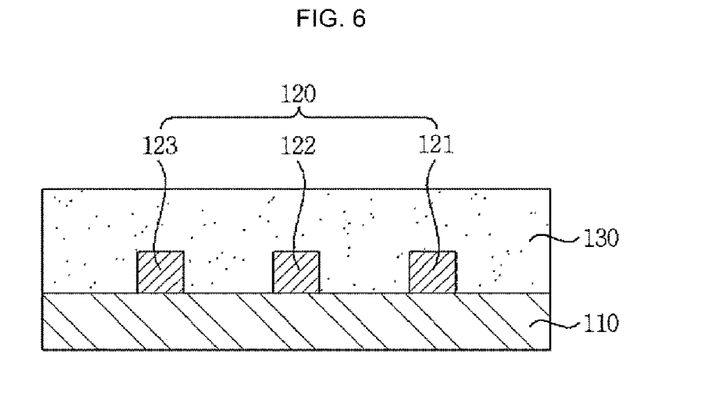

Referring to FIG. 6, an insulating layer 130 is coated on the substrate 110 to embed the first circuit layer 120. A photosensitive insulating layer, which does not include a glass sheet, may be used as the insulating layer 130 to use a photolithography to form via holes later.

Figure 7:
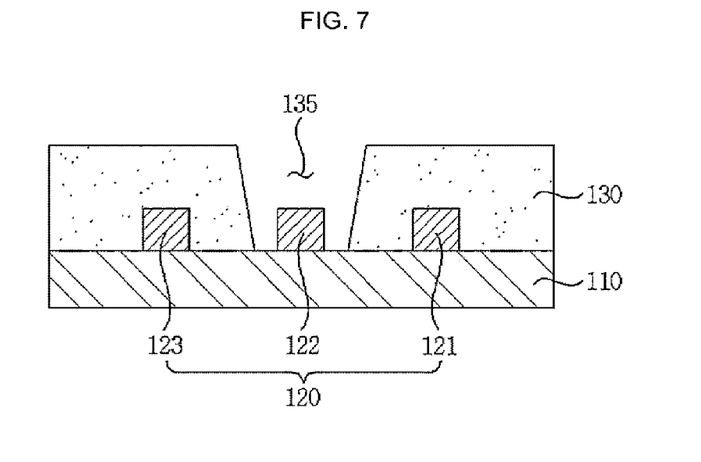

Referring to FIG. 7, a portion of the insulating layer 130 located where a via is to be formed is removed in order to form a via hole 135. The insulating layer 130 may be removed by using a photolithograph process involving an exposing process and a developing process.

In this example, the circuit pattern 122 of the first circuit layer, which is to be connected with the second circuit layer later through a via, may be exposed through the via hole 135.

According to an embodiment of the present disclosure, a plurality of vias holes may be formed using the photolithography at the same time, so that it may reduce manufacturing cost.

Figure 8:
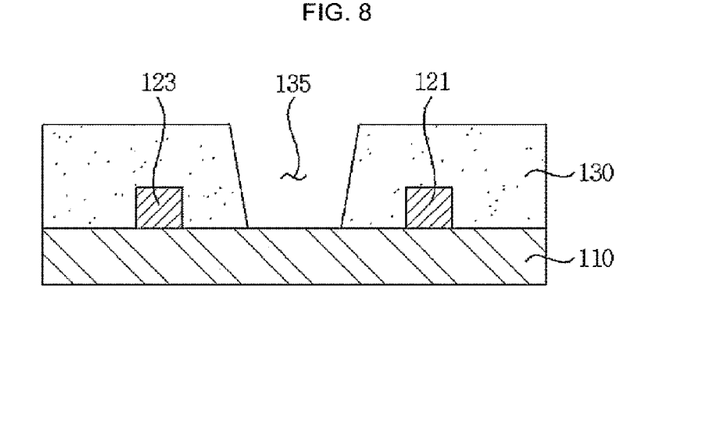

Referring to FIG. 8, the circuit pattern 122, which is located inside the via hole 135 and exposed, is eliminated to expose the part of the substrate 110 corresponding to the lower part of the via hole 135. The circuit pattern 122 may be eliminated using an etching process.

Figure 9:
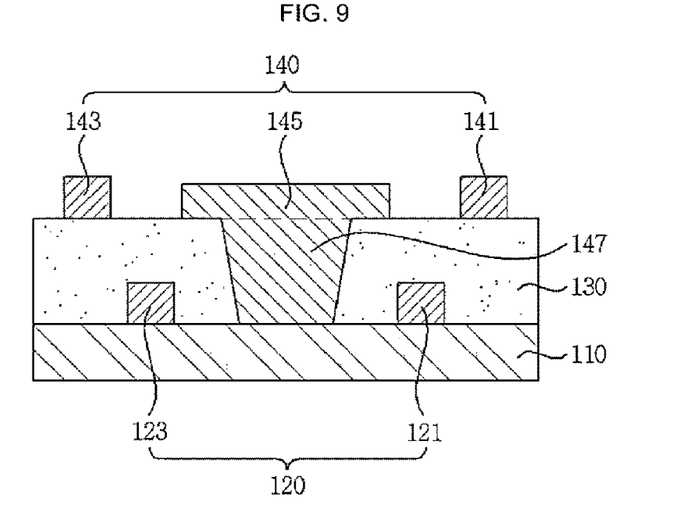

Referring to FIG. 9, the second circuit layer 140 including the via hole 135 and the via 147 on the insulating layer 130 is formed.

The second circuit layer 140 includes a plurality of circuit patterns 141, 143 and an upper via land 145 that is formed on the upper part of the via 147.

Referring to FIG. 3, the second circuit layer 140 may also include a circuit pattern 142 that is integrally formed with the via 147 through the upper via land 145.

The second circuit layer 140 and the via 147 may be formed at the same time by the same process, so that the via 147 and the circuit pattern 142, which is connected with the via through the land 145, may be integrally formed.

The upper via land 145 may be formed to have a greater diameter than that of the via with consideration of a processing error.

The second circuit layer 140 including the via 147 may be formed through a general circuit forming process such as a semi additive process (SAP), a modified semi additive process (MSAP), an additive process, and a subtractive process.

For example, the second circuit layer 140 including the via 147 may include a seed layer such as an immersion plating layer and an electro plating layer.

According to an example of the present disclosure, high density, fine pattern and fine pitch circuit may be implemented by eliminating the via land at the lower part.

The photolithography may be used, instead of a conventional laser process, to form the via hole to form a plurality of vias holes at the same time, such that it may reduce manufacturing cost.

According to an example of a printed circuit board and a method of manufacturing the same, a printed circuit board with fine patterns and fine pitches may be obtained, and a a via size of the printed circuit board may be reduced.

According to another example of a printed circuit board and a method of manufacturing the same, it is possible to implement high density in the printed circuit board by eliminating a lower part via land.

According to another example of a printed circuit board and a method of manufacturing the same, a plurality of vias may be formed at the same time, thus reducing the manufacturing cost of producing the printed circuit board.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   a first circuit layer on an upper surface of a substrate;
   an insulating layer disposed on the substrate and the first circuit layer;
   a second circuit layer protrude on an upper surface of the insulating layer; and
   a via configured to connect between the first circuit layer and the second circuit layer,
   wherein the upper surface of the substrate comprises one portion covered by the first circuit layer and the other portion, wherein a lower part of the via is directly in contact with the other portion of the upper surface of the substrate,
   wherein the first circuit layer comprises a circuit pattern, a side surface of the circuit pattern is directly in contact with a side surface of the via, and
   wherein the circuit pattern has a smaller line-width than the via, and
   the insulating layer is a photosensitive resin layer.

2. The printed circuit board of claim 1, wherein the second circuit layer comprises an upper via land formed on the upper part of the via.

3. The printed circuit board of claim 1, wherein the second circuit layer comprises a circuit pattern formed integrally with the via.

4. A printed circuit board comprising:
   circuit layers;
   an insulating layer disposed between the circuit layers and comprising an insulating resin; and
   a via interconnecting the circuit layers and comprising copper,
   wherein a lower part of the via comprises a landless via in contact with the insulating layer, one of the circuit layers comprises a circuit pattern having a smaller line-width than the via, and
   the insulating layer is a photosensitive resin layer.

5. A printed circuit board comprising:
   a lower part circuit layer disposed on a lower surface of an insulating layer;
   an upper part circuit layer; and
   a via formed in the insulating layer to connect the lower part circuit layer and the upper part circuit layer with each other,
   wherein the lower surface of the insulating layer comprises one portion covered by the lower part circuit layer and the other portion, where the via extends from the lower surface of the upper part circuit layer to the other portion of the lower surface of the insulating layer, wherein the lower part circuit layer comprises a circuit pattern, a side surface of the circuit pattern is directly in contact with a side surface of the via and wherein the circuit pattern has a smaller line-width than the via, and the insulating layer is a photosensitive resin layer.

6. The printed circuit board of claim 5, wherein the upper part circuit layer comprises an upper via land formed on an upper part of the via.

7. The printed circuit board of claim 5, wherein the upper part circuit layer comprises a circuit pattern formed integrally with the via.

8. A printed circuit board comprising:

a first circuit layer disposed on one surface of a substrate;

an insulating layer disposed on the substrate and the first circuit layer;

a second circuit layer disposed on the insulating layer; and a via penetrating the insulating layer and electrically connecting the first circuit layer and the second circuit layer, a portion of a side surface of the via being in contact with the first circuit layer, wherein the one surface of the substrate comprises one portion covered by the first circuit layer and the other portion, wherein a bottom surface of the via is directly in contact with the other portion of the one surface of the substrate, wherein a portion of a side surface of the via is directly in contact with a side surface of the first circuit layer, and wherein one of the first and second circuit layer comprises a circuit pattern having a smaller line-width than the via, and the insulating layer is a photosensitive resin layer.

* * * * *